United States Patent [19]

Frehling

[11] Patent Number: 4,801,950
[45] Date of Patent: Jan. 31, 1989

[54] MULTI-BEAM ROLLER PHOTOTRACER

[75] Inventor: André Frehling, Maisons-Alfort, France

[73] Assignee: Societe d'Etudes et de Constructions de Machines et Appareils Industriels, Alfortville, France

[21] Appl. No.: 85,182

[22] Filed: Aug. 14, 1987

[30] Foreign Application Priority Data

Aug. 20, 1986 [FR] France ................................. 8611890

[51] Int. Cl.$^4$ .............................................. G01D 9/42
[52] U.S. Cl. .................................. 346/108; 346/76 L; 358/302
[58] Field of Search ............... 346/108, 76 L; 358/302

[56] References Cited

U.S. PATENT DOCUMENTS 4,513,326 4/1985 Kokaji .
4,547,814 10/1985 Hirosawa ............................ 358/302

FOREIGN PATENT DOCUMENTS 8505059 7/1985 Fed. Rep. of Germany .
2385112 10/1978 France .
2413677 7/1979 France .
2509556 1/1983 France .
2075704 11/1981 United Kingdom .

OTHER PUBLICATIONS

"Laser Pattern Generator for Printed Circuit Artwork", *Transactions of the Institute of Metal Finishing*, vol. 60, No. 4, by H. R. Shemilt, 1982, pp. 137–140.
"High—Speed Facsimile Recording with Laser Light Sources", *IEEE Transactions on Communications*, vol. COM-20, No. 1, by Akira Fukumoto et al., Feb. 1972, p. 23–27.

*Primary Examiner*—E. A. Goldberg
*Assistant Examiner*—Huan H. Tran
*Attorney, Agent, or Firm*—Young & Thompson

[57] ABSTRACT

The roller phototracer for producing images on photosensitive films inter alia for the manufacture of printed circuits, comprises a film-holding roller movable in rotation and an optics-carrying slide movable in translation along an axis parallel to the axis of the roller, the optics-carrying slide bearing an optical device optically connected to a laser emitter via at least one space filter and at least one acousto-optical modulator for directing a light beam towards the film or switching of the beam in order to light up or extinguish a set of lines of light spots on the film depending on the rotation of the roller and the elementary movements of the slide. The phototracer is characterised in that it also comprises structure for directing a number of light beams towards the film simultaneously and from the same laser emitter, and structure for bringing about a partial overlap of the light spots on the film.

12 Claims, 5 Drawing Sheets

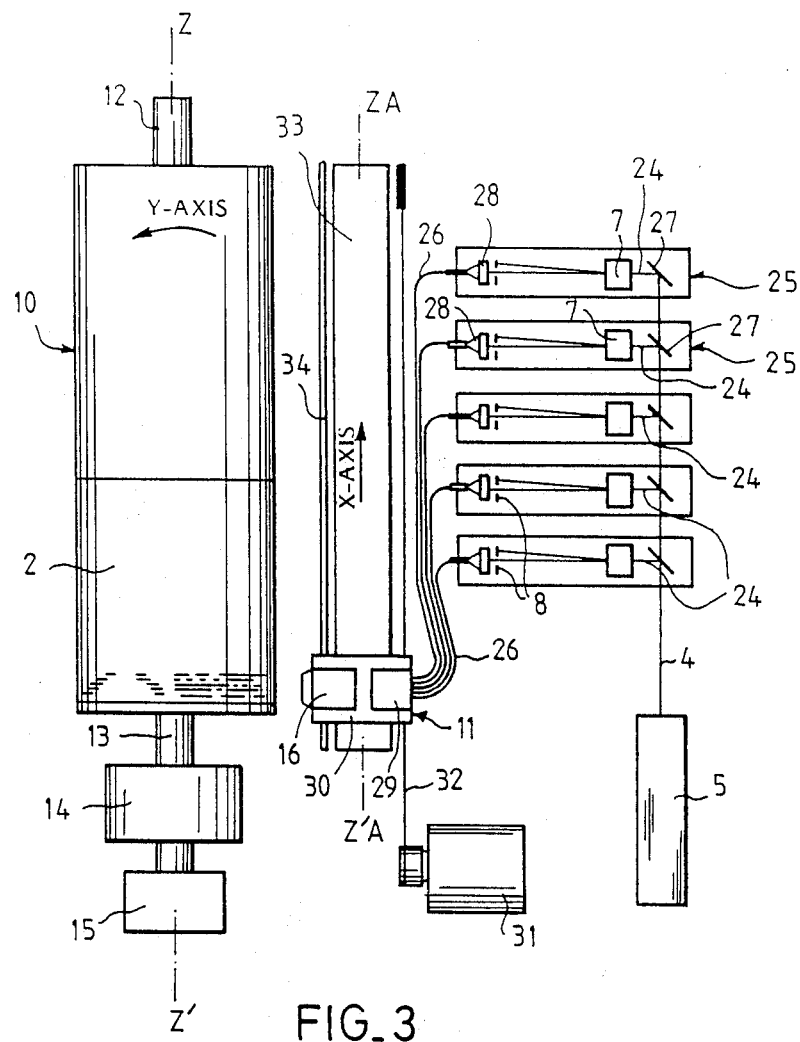
FIG_3
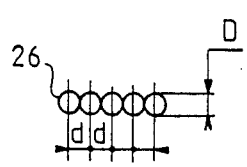
FIG_4
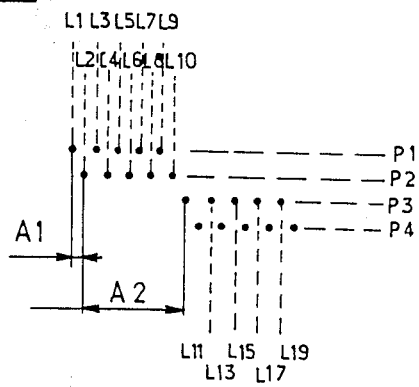
FIG_5

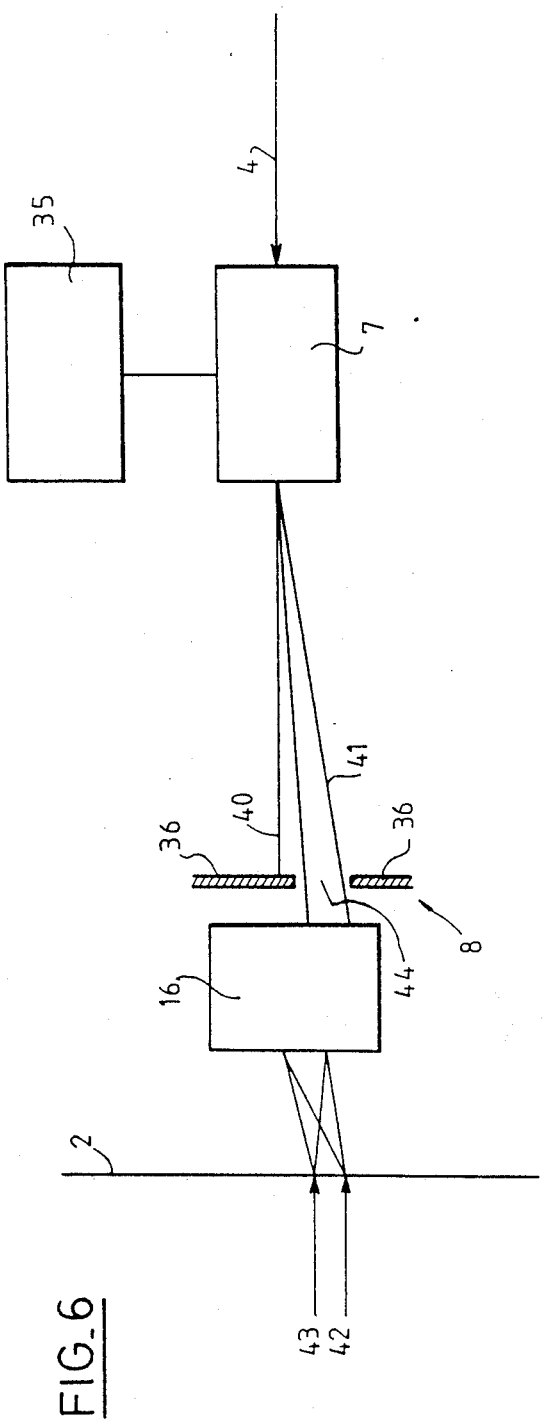
FIG_6
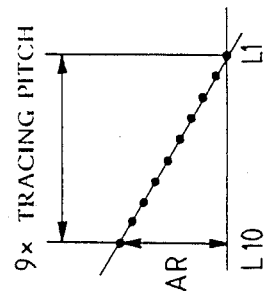
FIG_7

MULTI-BEAM ROLLER PHOTOTRACER

The invention relates to a multi-beam roller phototracer for producing an image on photosensitive films inter alia for the manufacture of printed circuits by photogravure.

A known single-beam phototracer comprises a film-holding roller movable in rotation and an optics-carrying slide movable in translation along an axis parallel to the film-holding roller axis. In this embodiment, the slide bears an optical device optically connected to a laser emitter via a space filter and an acousto-optical modulator so as to direct a light beam towards the film or cut off the beam, thus lighting up or extinguishing a set of lines of light spots on the film, depending on the rotation of the roller and the elementary movements of the slide. This device will be described in greater detail hereinafter with reference to FIG. 1 of the accompanying drawings.

The image obtained by means of the phototracer is accordingly made up of isolated points or pixels on a series of vertical and horizontal lines, the vertical lines being obtained e.g. by moving the film-holding roller through an angle whereas the horizontal lines are obtained by linear motion of the optics-carrying slide, which moves through successive distances corresponding to the tracing pitch or increment.

A machine of the aforementioned kind gives satisfactory results but has the disadvantage of not being very quick. Films intended for the manufacture of printed circuits, which by nature are sensitive to temperature and humidity, cannot be manufactured in advance and stored since they may become deformed and thus become useless for constructing the corresponding printed circuits. They are therefore manufactured on demand but in a short time.

Attempts have therefore been made to increase the speed of production of these films. One method would be to increase the speed of rotation of the film-holding roller. The inherent disadvantages of this increase in speed are connected with the resulting high angular acceleration of the roller. For example, a roller 200 mm in diameter and rotating at 1200 rpm already has an angular acceleration of 45 g (g being the gravitational acceleration or 9.81 m/s$^2$). The acceleration increases to 100 g if the roller speed is 1800 rpm and 400 g at a speed of 3600 rpm. This acceleration increases the roller diameter by 0.023 mm at 1200 rpm, 0.051 mm at 1800 rpm and 0.2 mm at 3600 rpm. Under these conditions it becomes very difficult to hold the film against the roller surface, advantageously by suction, and when the film stops moving the difference between the elongation of the roller and the film results in an inaccurate tracing and makes it difficult to obtain a good-quality printed circuit.

To increase the film manufacturing rate, other designers have proposed a machine (illustrated in FIG. 2 of the accompanying drawings) in which the film is secured in a stationary hemi-cylinder along the axis of which a light beam moves, the beam being emitted by a mirror which can rotate at 1500 rpm. This machine is particularly efficient but unfortunately is extremely expensive.

The object of the invention therefore is to propose a roller phototracer having a tracing speed which is increased by multiplying the number of tracing light beams, whereas the rotation speed of the roller remains the same as that of a single-beam machine of the previously-mentioned kind, and the device is not prohibitively expensive.

The invention therefore relates to a phototracer comprising a film-holding roller movable in rotation and an optics-carrying slide movable in translation along the axis of the film-holding roller, the optics-carrying slide bearing an optical device optically connected to a laser emitter via at least one space filter and at least one acousto-optical modulator for directing a light beam towards the film or switching off the beam in order to light up or extinguish a set of lines of light spots on the film depending on the rotation of the roller and the elementary movements of the slide.

According to the invention, the phototracer is characterised in that it also comprises means for directing a number of light beams towards the film simultaneously and from the same laser emitter, and means for bringing about a partial overlap of the light spots on the film.

The number of beams can thus be multiplied so as to trace a number of lines of pixels on the film at each advance of the optics-carrying slide, thus multiplying the tracing speed by the number of available light beams.

Also, the partial overlap of the beams improves the quality of the edge of the trace by reducing the ripple thereof.

According to the first advantageous embodiment of the invention, the laser emitter is stationary and the light beam emitted by the laser emitter is divided into a number of light beams in a number of likewise stationary optical sub-systems each comprising an acousto-optical modulator and a space filter, each optical sub-system being connected to the slide by an optical fibre.

Thus a single laser emitter is used to generate a number of light beams and simultaneously trace a number of lines of pixels on the film. Also, since the laser emitter and the beam-splitting optical sub-systems are stationary and connected by optical fibres to the optics-carrying slide, the movable optical part of the phototracer is reduced, thus increasing reliability and reducing inertia.

According to another advantageous embodiment of the invention, the acousto-optical modulator is disposed on the slide and is connected to a multi-frequency acoustic generator for deflecting the incident laser beam through an angle proportional to the frequency of the sound wave emitted by the acoustic generator, the genereator delivering a number of waves in succession for each elementary position of the slide, the frequency of the waves increasing during a time short enough for the angular motion of the roller to be negligible during it, and the optical device interposed between the roller and the modulator comprises a focusing lens and a space filter interposed between the lens and the modulator so as to admit only those beams which are deflected in correspondence with the aforementioned sound frequencies.

As before, therefore, a single laser emitter is used to generate a number of light beams and trace a number of lines of pixels on the film in each elementary position of the optics-carrying slide.

Other features and advantages of the invention will be clear from the following description and the accompanying drawings, given by way of non-limitative example, in which:

FIG. 3 is a diagrammatic plan view of a multi-beam roller phototracer according to a first embodiment of the invention;

FIG. 4 shows the arrangement of optical fibres in the fibre-connecting unit mounted on the slide of the phototracer in FIG. 3;

FIG. 5 illustrates the elementary movements of the slide in the phototracer in FIG. 3;

FIG. 6 is a diagrammatic plan view of a multi-beam phototracer according to a second embodiment of the invention;

Figure 8:
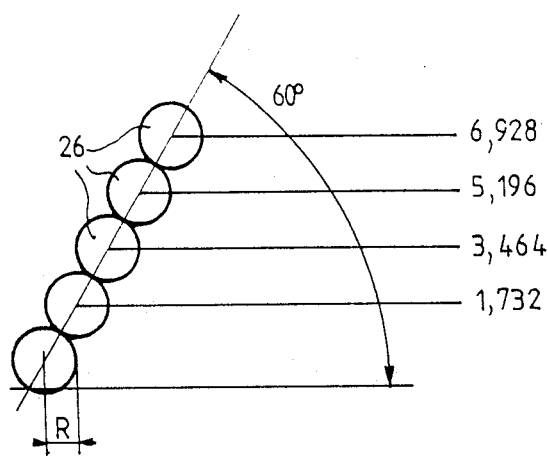
Figure 9:
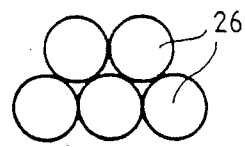
Figure 10:
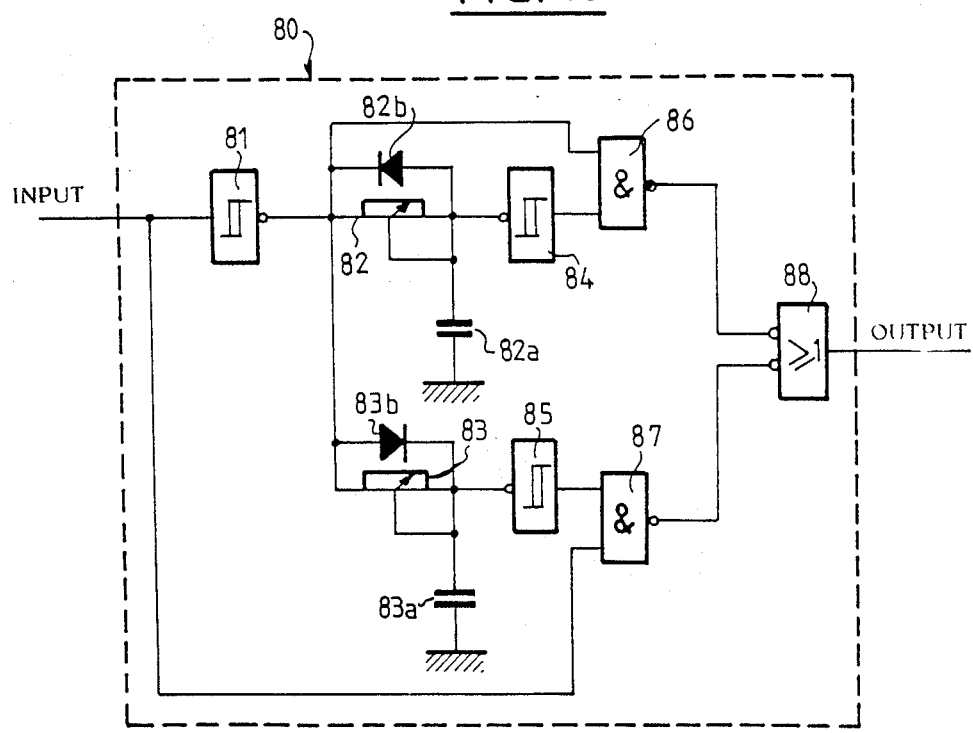
Figure 11:
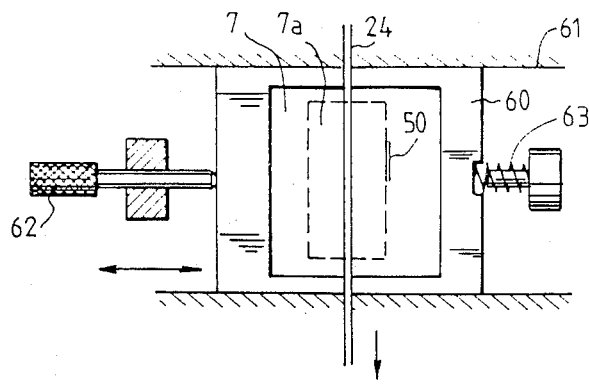
Figure 12:
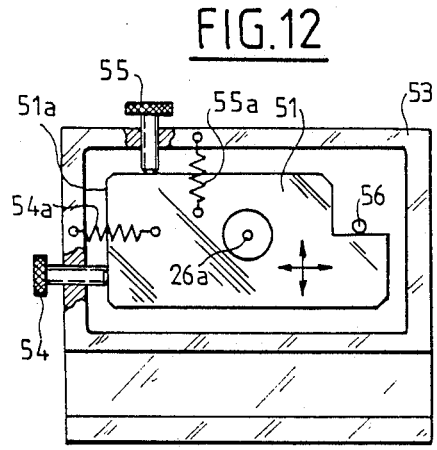
Figure 13:
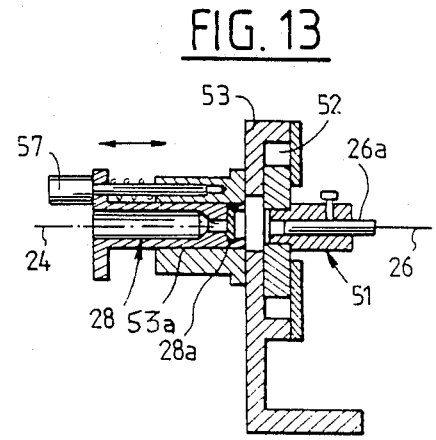
Figure 14:
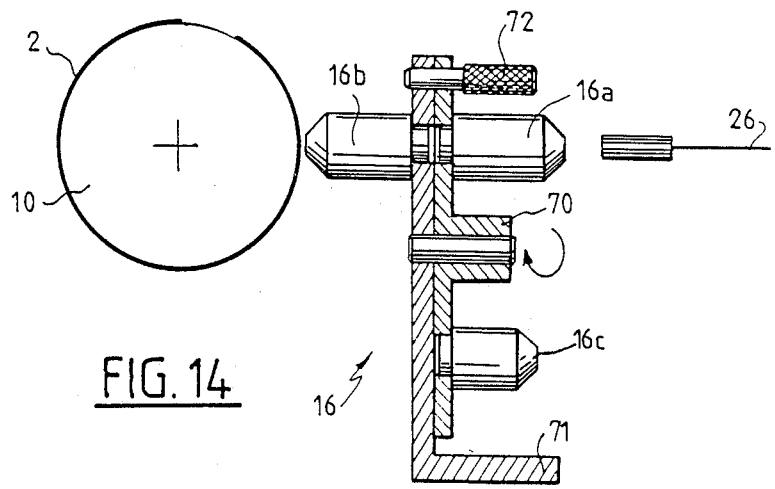

FIG. 7, in the case of the phototracer in FIG. 6 illustrates the advance of the film holding roller between tracing the first pixel and tracing the tenth, when the slide is in a given position;

FIGS. 8 and 9 show other arrangements of the optical fibres in the fibre-connecting unit;

FIG. 10 is a diagram of an analog circuit for compensating the delay in the light beam;

FIG. 11 shows the means for adjusting an acousto-optical modulator according to the invention;

FIGS. 12 and 13 show the means for adjusting an optical sub-assembly according to the invention, and FIG. 14 shows the optical device for the first embodiment of the invention.

Figure 2:
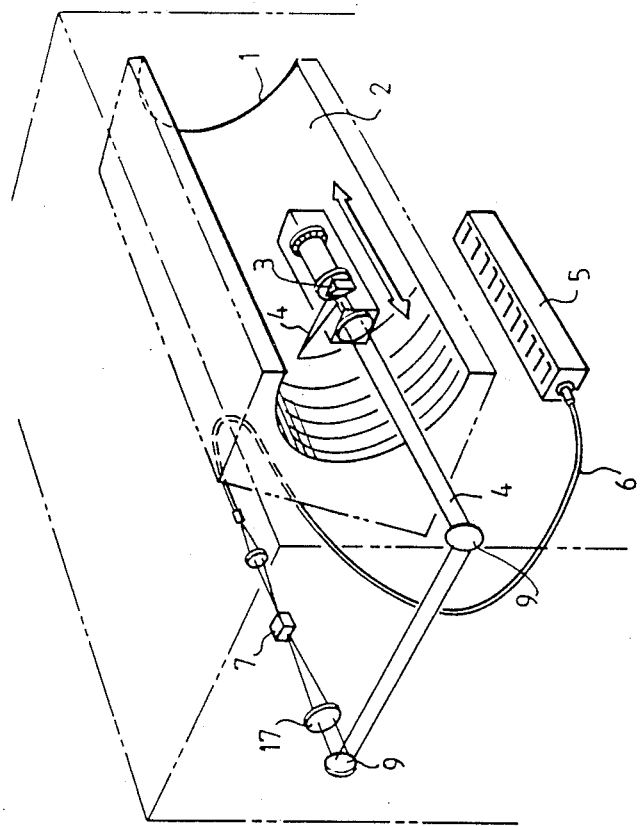
FIG. 2 is a diagrammatic perspective view of a phototracer operating at an improved speed according to the prior art.

FIG. 2 shows the rotating mirror phototracer already mentioned in the opening part of the present specification, and is provided only to illustrate the prior art. The phototracer comprises a hemi-cylinder 1 having an inner surface on which a photosensitive film 2 is disposed so as to produce images on it for manufacturing a given printed circuit. The method of manufacturing a printed circuit from images produced on a film is known per se and will not be described. Inside the hemi-cylinder 1, a mirror 3 mounted on ball bearings can rotate at up to 15,000 rpm and move in translation parallel to film 2 along the axis of hemi-cylinder 1. Mirror 3 is adapted to reflect a light beam 4 emitted by a laser source 5 and sent towards the rotating mirror 3 by an optical fibre 6, an acousto-optical modulator 7, a beam magnifier 17 and a set of fixed mirrors 9. In accordance with the angular and linear motion of mirror 3, the light beam 4 scans film 2 whereas the modulator 7 is used as a high-speed optical switch for lighting up or extinguishing a light spot on the film in accordance with the desired case.

This machine, however efficient, has the serious disadvantage of being particularly expensive.

Figure 1:
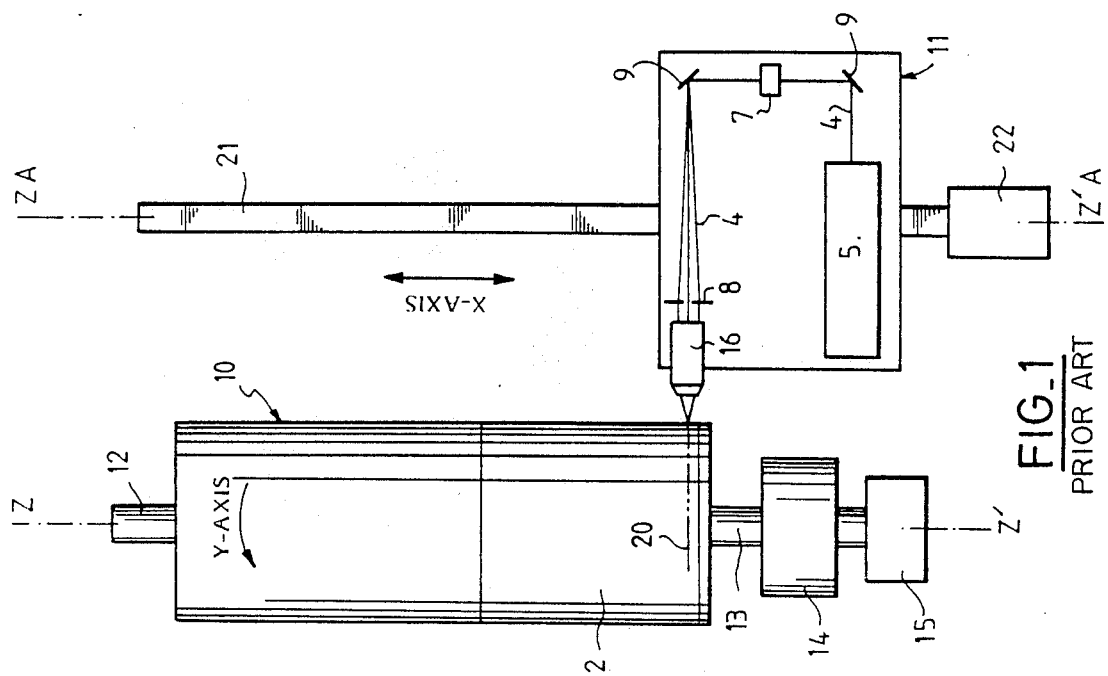
FIG. 1 is a diagrammatic plan view of a single light-beam roller phototracer according to the prior art.

In order to obtain performances comparable with those of the previously mentioned machine but under much more favourable economic conditions, the aim of the invention by contrast is to improve the phototracer previously mentioned and shown in FIG. 1, which more specifically comprises a film-holding roller 10 movable in rotation around an axis Z—Z' and an optics-carrying slide 11 movable in translation along an axis ZA—Z'A parallel to the axis Z—Z' of roller 10. The photosensitive film 2 is held pressed against the outer surface of roller 10 by suction, the roller being hollow and its side being perforated (not shown) and one of its ends 12 being connected to suction means (not shown). The other end 13 of roller 10 is connected to an electric driving motor 14, and the angular position of roller 10 is monitored by a pulse generator 15 which rotates integrally with the rotor shaft 14. After electronic multiplication, generator 15 delivers one pulse per tracing increment, in which case the angular motion of roller 10 corresponds to the interval (called the tracing pitch) between two spots or pixels on the film. In this kind of machine, the tracing pitch is preferably equal to 0.0254 mm or 0.0127 mm but can be even smaller. The smaller the tracing pitch, of course, the more accurate is the trace, but of course this increases the time for manufacturing the film and requires a machine which is more accurate and therefore more expensive.

Slide 11 also carries an optical device 16 which in the present case is a lens for giving the light spots the desired diameter on the film, and a laser emitter 5 is optically connected to lens 16 via a first mirror 9, an acousto-optical modulator 7, a second mirror 9 and a space filter 8.

In known manner, the modulator 7 associated with filter 8 is used as a high-speed optical switch. Accordingly, the modulator comprises a crystal having a refractive index which is modified by exciting it by an ultra-high frequency sound wave so as to deflect the incident beam through an angle proportional to the frequency of the exciting sound wave. More specifically, when modulator 7 is not excited, the incident beam is not deflected and is therefore reflected at right angles at the second mirror 9 and then stopped by striking the sides of the space filter 8. When modulator 7 is excited, the incident beam is deflected so that after being reflected at mirror 9, it travels through the opening of filter 8 and is then directed towards film 2 by lens 16.

Thus, depending on whether the modulator 7 is excited or not, beam 4 is directed towards film 2 or is cut of, thus lighting up or extinguishing a set of lines 20 of light spots (or pixels) on the film, depending on the rotation of roller 10 and the elementary movements of slide 11 and in accordance with the desired trace. The resulting trace is therefore made up of isolated points on a series of vertical lines (Y axis) and horizontal lines (X axis), the vertical lines being obtained by angular motion of roller 10 whereas the horizontal lines are obtained by linear motion of slide 11, which moves through successive distances corresponding to the tracing pitch or increment of the phototracer (e.g. 0.0254 mm or 0.0127 mm). In the phototracer in FIG. 1, the linear motion of slide 11 is brought about by a ball screw 21 driven by an electric motor 22.

We shall now describe two improved embodiments according to the invention with reference to FIGS. 3–7, without detailing those parts of the two machines which correspond to parts already described with reference to FIG. 1.

FIG. 3 shows a phototracer comprising a laser emitter 5 which is stationary relative to an optics-carrying slide 11 and produces a light beam 4 divided into a number of light beams 24 (five in the example shown) in five optical sub-systems 25 which are likewise stationary relative to slide 11, each optical sub-system 25 being connected to slide 11 by an optical fibre 26 so to direct a number of light beams simultaneously towards the photosensitive film 2 mounted on roller 10 in every position of slide 11. For economic reasons, it is not advantageous to provide more than five optical sub-systems.

In the example shown, the optical sub-systems 25 are disposed parallel to one another and perpendicular to the laser beam 4 and to the direction of motion of slide 11 (X axis) and to the axis Z—Z' of roller 10. Each sub-system 25 comprises, in alignment, a beam splitting mirror 27 adapted to divide a part of the incident beam 4 at right angles (in the example shown, a fifth of the beam power for the first mirror, and a quarter for the second, a third for the third and half for the fourth mirror), an acousto-optical modulator 7 and a space filter 8 operating as a high-speed optical switch as previously described, and an optical focusing device 28 connected to the optical fibre 26 in order to guide the deflected beam 24 therein. Of course, the length of each optical fibre will be chosen so that slide 11 can move all the way along the roller 10; this movement is also made easier by the natural flexibility of the fibres.

The optical device mounted on slide 11 comprises a lens 16 having its axis perpendicular to the axis Z—Z' of roller 10 and a unit 29 for connecting the fibres 26, in which the ends of fibres 26 are disposed so that the axes are parallel to the axis of lens 16. The diameter D of fibres 26 and the distance d between the axes of two adjacent fibres (FIG. 4) are chosen in accordance with the tracing pitch of the light spots on the film 2 (0.0254 or 0.0127 mm) and the lens ratio (half or one) so that the diameter of the light spots is between one and a half and twice the tracing pitch. This, as experience has shown, gives the best quality edges of the trace on the film.

The reason is that adjacent spots partly overlap, up to 50% when the diameter of the spots is twice the tracing pitch, thus greatly reducing the ripple at the edge of the trace.

More specifically, depending on the lens ratio, the diameter D of the fibres determines the diameter of the light spot whereas the distance d between the axes of two adjacent fibres determines the tracing pitch. Thus, if the fibre diameter D is about 45 microns and the distance d between the axes of two adjacent fibres is 0.0508 mm, so that the fibres are practically side by side, and if the lens ratio is unity, the tracing pitch can be 0.0254 mm and the spot diameter can be 45 microns, i.e. almost twice the tracing pitch, whereas if the lens ratio is ½, the tracing pitch can be 0.0127 mm and the spot diameter 22.5 microns, i.e. about twice the tracing pitch as before.

Thus (FIG. 5) in the first elementary position P1 of slide 11 and during the first rotation of roller 10, the vertical lines (Y axis) L1, L3, L5, L7 and L9 are drawn (since the distance d is twice the tracing pitch for a lens ratio of unity and four times the tracing pitch for a lens ratio of ½) so that during the second rotation of the roller, in order to trace lines L2, L4, L6, L8 and L10, the advance A1 of slide 11 must correspond to one tracing pitch (0.0127 or 0.0254 mm depending on the lens ratio). In order therefore to trace the lines L11, L13, L15, L17 and L19 during the third revolution of the roller, the second advance A2 thereof must correspond to a distance equal to nine times the tracing pitch, and so on.

In the single-beam machine described with reference to FIG. 1, the advance of the optics-carrying slide corresponding to one revolution of the film-holding roller is at most equal to the tracing pitch, e.g. 0.0254 mm. If this advance occurs during the rotation of the roller, the error in alignment, i.e. the offset along the roller axis between the first and the last pixel of a vertical line (Y axis) is at most equal to the tracing pitch, which is acceptable.

In the multi-beam machine described hereinbefore, the alignment error will reach unacceptable values if the slide advances continuously, since the advance can be nine times the tracing pitch. According to the invention, therefore, each advance of the slide occurs during an idle part of the rotation of the roller, i.e. when the lens is disposed opposite that region of the roller which has no film, i.e. the film covers only a narrow longitudinal strip of the roller surface.

The time during which this narrow strip moves in front of the lens, i.e. during which the elementary movements of the slide must be made, is very short. Consequently in FIG. 3 the ball screw of the single-beam phototracer, which has too much inertia, is replaced by a linear motor 30 or a motor and reduction gear 31 associated with a drive by cable or a thin sheet-metal strip (about 0.2 mm), the slide being mounted on a rail 33. A linear position coder 34 is used to monitor the linear motion of slide 11.

In the single-beam phototracer in FIG. 1, the digital control of the machine is adapted to trace pixels on the film corresponding to increasing dimensions along each vertical line (for the Y axis).

In the five-beam machine described hereinbefore, the order in which the pixels are placed is somewhat more complex. The machine is digitally controlled, the central memory receiving the trace of the vertical lines in groups of ten lines, so that the first pixel of lines L1, L3, L5, L7 and L9 is first traced followed by the second pixel of the same lines and so on. When all the pixels of lines L1, L3, L5, L7 and L9 have been traced, the slide advances through a distance equal to the tracing pitch and the first pixel of lines L2, L4, L6, L8 and L10 is traced followed by the second pixel of the same lines and so on. When all the pixels of the first ten lines have been traced, the slide advances through a distance equal to nine times the tracing pitch, after which the next ten lines are traced as before.

This "mixing" of pixels is brought about by suitable data-processing software or by electronic cards.

Instead of a laser beam divided by beam-dividing mirrors, this kind of "interlaced" tracing can be brought about by using a number of electroluminescent diodes provided that their emission colours are compatible with the sensitive wavelength of the films used on this kind of machine.

The machine also has advantageous modular characteristics. For example the number of beams can be small at purchase and then increased as needed. It will only be necessary to adapt the digital control by modifying the software or by changing the cards.

Finally, since the design to be traced on film 2 may for example be a printed circuit requiring a highly accurate trace, it is particularly necessary to use high-quality optical fibres 26 and arrange them carefully. Thus, along a trace parallel to the axis of roller 10, an interval of one $\mu$s generates a shift of 0.0127 mm in the edge of the trace. The accuracy required for the phototracer according to the invention is less than five microns, and consequently there must be a tolerance of less than two microns in the diameter D of fibres 26 and the horizontal alignment. Accordingly, the laser light beam must be concentrated in each fibre 26 in order to obtain substantially uniform illumination thereof at the output. Accordingly, as shown in FIGS. 12 and 13, the invention provides a suitable method of mounting each fibre terminal connected to the corresponding optical sub-system 25, and means for adjusting the terminal with respect to the associated focusing optical device 28. Thus, the terminal 26a of each fibre 26 is secured in a holding component 51 mounted so that it can move vertically and horizontally perpendicular to the axis of terminal 26a in a slideway 52 in a bearing component 53. Component 51 is moved horizontally and vertically respectively by screws 54, 55 secured to component 53 and having their ends mounted so as to abut flanges 51a on compnent 51 (see FIG. 12). Screws 54 and 55 are actuated so as to tension or relax springs 54a and 55a as required, and thus more precisely adjust the position of component 51. Finally, the motion of component 51 is limited by an abutment 56 secured to component 53.

On the side opposite the fibre terminal 26a, component 53 is shaped so as to hold component 51 coaxially with the the optical device 28 for focusing the optical sub-system 25 in question. More particularly, device 28 comprises a focusing lens 28a, the axial distance of which from terminal 26a is adjustable by a screw 57 for sliding the device 28 in a sleeve 53a in component 53.

The three screws 54, 55 and 57 can therefore be used for three-dimensional adjustment of the device for concentrating the laser light beam in each optical fibre 26.

In another improvement according to the invention, each acousto-optical modulator 7 comprises adjusting means for compensating the delay in deflecting the light beam due to the speed of propagation (about 3000 m/s) of the ultra-high frequency sound wave in the crystal of modulator 7, allowing for the distance between the sound wave and the light beam from the emitting electrode.

As shown in FIG. 11, each modulator 7 is disposed on a slide 60 movable in translation along a guide rail 61. A screw 62 acts on slide 60 against a return spring 63 so as to move modulator 7 in translation and consequently adjust the distance between the beam 24 and the high-frequency excitation electrode 50 of the modulator crystal 7a.

Each of the five modulators 7 of the previously described multi-beam phototracer is designed in the same manner, and consequently the five corresponding delays can be made equal to within 0.2 μs, thus improving the quality of the trace.

A device 16 shown on the slide 11 is detailed in FIG. 14. A lens 16a having a given focal length L gives the fibres an image at infinity. A lens 16b gives an image of the preceding image at a magnification of unity if its focal length is identical with that of lens 16a or ½ if its focal length is 2F. To obtain the two ratios 1 and ½ without loss of clearness, the focal planes of lenses 16a and 16b must be in the same plane as fibres 26.

In order selectively to obtain the ratio 1 and ½, two lenses 16c and 16b having focal lengths F and F/2 respectively are mounted on a rotary drum 70 on a holder 71. Each of the two positions of drum 70 is lockable by an indexing means 72.

FIGS. 8 and 9 show variant arrangements of fibres 26 in the connecting unit 29, the resulting simplified mechanical assembly being of use for obtaining a 50% overlap R of pairs of adjacent light spots.

More particularly as shown in FIG. 8, each elementary advance of slide 11 must be equal to five times the tracing pitch whereas the delay (indicated by the number of pixels in FIG. 8) introduced by the arrangement of fibres 26 along an oblique axis at 60° with respect to the axis of roller 10 must be compensated by suitably controlling the deflection of the light beams at each associated modulator 7.

Thus, as will easily be understood by the skilled addressee, the integral part of each delay can be compensated by adapting the control software of the phototracer, whereas the functional part can be concentrated by an electronic delay circuit 80 such as shown in FIG. 10 and associated with each acousto-optical modulator 7 and acting on the excitation control thereof so as selectively to delay the positive edge or the negative edge of the exciting sound wave.

At its input, circuit 80 comprises a first Schmidt trigger 81 whose output is connected to two potentiometers 82, 83 whose output and variable potential output are connected to earth via a capacitor 82a, 83a respectively. The terminals of each potentiometer 82, 83 are connected in parallel to a diode 82b, 83b, the said two diodes being inverted with respect to one another.

The output of each potentiometer 82, 83 is connected to a Schmidt trigger 84, 85 respectively, the output of which terminates at the first input of a NAND gate 86, 87, the second input of the first NAND gate 86 being connected to the input terminal of the potentiometer whereas the second input of NAND gate 87 is connected to the input of circuit 80. The output of each gate 86, 87 is connected to a third NAND gate 88, which constitutes the control output of circuit 80.

A multi-beam phototracer according to a second embodiment of the invention is shown more diagrammatically in FIG. 6 since overloading the diagram has been avoided by omitting the film-holding roller, the optics-carrying slide, the means for driving the roller and slide and the laser emitter, since these components are comparable to those in the machine in FIG. 3.

In the second embodiment, the slide (not shown) carries a concentrating lens 16, a space filter 8, an acousto-optical modulator 7 and a laser emitter (not shown). The laser emitter is preferably disposed on the slide but may alternatively be stationary and connected to the acousto-optical modulator e.g. by an optical fibre, provided that the characteristics of the laser beam are optically reconstituted at the fibre outlet (parallelism).

As in the case of the five-beam phototracer described previously, a multi-frequency acoustic generator 35 connected to modulator 7 and preferably installed in a fixed position is used for deflecting the incident laser beam 4 through an angle proportional to the frequency of the sound wave emitted by the acoustic generator. Initially, therefore, modulator 7 is used as a high-speed optical switch. In FIG. 6 for example, beam 40, which has not been deflected, is a non-modulated beam which comes out of the modulator when not excited, i.e. when the modulator does not receive any sound wave from the acoustic generator 35. This non-deflected beam 40 is thus stopped by one surface 36 of the space filter. On the other hand when the modulator is excited, it outputs deflected beams such as beam 41, which travels through the opening 44 of filter 8.

In practice, in order simultaneously to trace a number of vertical lines of pixels in each elementary position of the optics-carrying slide, generator 35 successively delivers ten sound waves at increasing frequencies so as to givew 10 emergent beams at the modulator output, the beams being deflected at angles increasing in proportion to the frequency of the emitted sound waves. Accordingly, the opening 44 of filter 8 is dimensioned so as to transmit only the ten beams which have been modulated and therefore deflected in correspondence with the aforementioned sound waves.

The focusing lens 16 and the difference between two successive frequencies are determined so that the distance between two pixels on the same horizontal line of film 2 is equal to the tracing pitch, e.g. 0.0127 mm.

Lens 15 is also designed so that the diffraction spot of each pixel is sufficiently large for partial overlap of pairs of adjacent pixels.

The ten sound frequencies, which are e.g. within the frequency range from 80 to 120 MHz, must be emitted in succession in order to avoid frequency combinations which would adversely affect the trace, but the time must be sufficiently short for the angular motion of the roller to be very small during this period. Accordingly, the ten frequencies can be emitted at intervals of 100 ns, leaving 0.9 microseconds between the tracing of the first pixel and the tenth pixel.

FIG. 7 very diagrammatically shows the advance AR of the roller between tracing a given point on the first vertical line L1 and the same point on the tenth line L10. In order to compensate this advance, which distorts the trace, the slide must be equipped with means (not shown) such that during the advance of the roller the slide is tilted in a transverse direction perpendicular to the roller axis so that the pixel of line L10 and the pixel of line L1 are substantially aligned along the roller axis.

Of course, since ten vertical lines are traced in each elementary position of the slide, each elementary advance of the slide will be ten times the tracing pitch. Also, as with the five-beam machine, the slide advances when the part of the roller surface moving in front of the lens is the longitudinal strip with no film.

Also, as in the five-beam machine, a special control is needed for tracing the pixel. It has to operate by successively storing ten lines and sequentially "sending" pixels 1 of lines 1 to 10 followed by pixels 2 of lines 1 to 10 and so on.

This special treatment can be brought about by data-processing software or by electronic cards.

Finally, in contrast to the five-beam machine, the present phototracer does not provide a choice between two tracing pitches, since it would be prohibitively expensive to modify the tracing pitches because in the present case they depend on a number of parameters.

Of course the invention is not limited to the examples described and illustrated, which can be modified in numerous ways without departing from the scope of the invention.

I claim:

1. A roller phototracer for producing images on photosensitive films inter alia for the manufacture of printed circuits, the phototracer comprising a film-holding roller (10) movable in rotation and an optics-carrying slide (11) movable in translation along an axis (ZA—Z'A) parallel to the axis (Z—Z') of the film-holding roller (10), the optics-carrying slide (11) bearing an optical device (16, 29; 16, 8) optically connected to a laser emitter (5) via at least one space filter (8) and at least one acousto-optical modulator (7) for directing a light beam (4) towards the film (2) or switching off the beam in order to light up or extinguish a set of lines of light spots on the film (2) depending on the rotation of the roller (10) and the movements of the slide (11), wherein the laser emitter (5) is stationary and the light beam (4) emitted by the laser emitter is divided into a number of light beams (24) in a number of likewise stationary optical sub-systems (25) each comprising an acousto-optical modulator (7) and a space filter (8), each optical sub-system being connected to the slide (11) by an optical fiber (26), the optical sub-systems (25) being disposed parallel to one another and perpendicular to the laser beam (4) and each optical sub-system (25) comprising in alignment, a beam-splitting mirror (27), an acousto-optical modulator (7), a spacer filter (8) and an optical focusing device (28) connected to an optical fiber (26), and wherein the optical device borne by the slide comprises a lens (16) having its axis perpendicular to the axis (Z—Z') of the roller (10) and also comprises a unit (29) for connecting the fibers (26), the ends of the fibers (26) therein being disposed so that the fiber axes are parallel to the axis of the lens (16), the diameter (D) of the fibers (26) and the distance (d) between the axes of each pair of adjacent fibers being also chosen in dependence on the light-spot tracing pitch and the lens ratio (16) so that the diameter of the light spots is between one and a half and twice the tracing pitch, in order to obtain a partial overlap of the light spots in the film (2).

2. A roller phototracer for producing images on photosensitive films inter alia for the manufacture of printed circuits, the phototracer comprising a film-holding roller (10) movable in rotation and an optics-carrying slide (11) movable in translation along an axis (ZA—Z'A) parallel to the axis (Z—Z') of the film-holding roller (10), the optics-carrying slide (11) bearing an optical device (16, 29; 16, 8) optically connected to a laser emitter (5) via at least one space filter (8) and at least one acousto-optical modulator (7) for directing a light beam (4) towards the film (2) or switching off the beam in order to light up or extinguish a set of lines of light spots on the film (2) depending on the rotation of the roller (10) and the movements of the slide (11), wherein the laser emitter (5) is stationary and the light beam (4) emitted by the laser emitter is divided into a number of light beams (24) in a number of likewise stationary optical sub-systems (25) each comprising an acousto-optical modulator (7) and a space filter (8), each optical sub-system being connected to the slide (11) by an optical fiber (26), and wherein the optical device borne by the slide comprises a lens (16) having its axis perpendicular to the axis (Z—Z') of the roller (10) and a unit (29) for connecting the fibers (26), the ends of the fibers (26) therein being disposed so that the fiber axes are inclined at an angle of 60° to the axis of the roller (10).

3. A roller phototracer for producing images on photosensitive films inter alia for the manufacture of printed circuits, the phototracer comprising a film-holding roller (10) movable in rotation, an optics-carrying slide (11) movable in translation along an axis (ZA—Z'A) parallel to the axis (Z—Z') of the film-holding roller (10), means (25, 26; 35) for directing a number of light beams towards the film (2) simultaneously and from a same laser emitter (5), and means for bringing about a partial overlap of the light spots on the film (2), the optics-carrying slide (11) bearing an optical device (16, 29; 16, 8) optically connected to said laser emitter (5) via at least one space filter (8) and at least one acousto-optical modulator (7) for directing a light beam (4) towards the film (2) or switching off the beam in order to light up or extinguish a set of lines of light spots on the film (2) depending on the rotation of the roller (10) and the movements of the slide (11), wherein the acousto-optical modulator (7) is disposed on the slide (11) and is connected to a multi-frequency acoustic generator (35) for deflecting the incident laser beam (4) through an angle proportional to the frequency of the sound wave emitted by the acoustic generator (35), the generator (35) delivering a number of waves in succession for each position of the slide (11), the frequency of the waves increasing during a time short enough for the annular motion of the roller (10) to be negligible during said time, and the optical device interposed between the roller (10) and the modulator (11) comprising a focusing lens (16) and a space filter (8) interposed between the lens (16) and the modulator (7) so as to admit only those beams (41) which are deflected in correspondence with the aforementioned sound frequencies.

4. A phototracer according to claim 1, in which the lens ratio is unity and the tracing pitch is 0.0254 mm, characterised in that the diameter (D) of the fibres (26) is substantially equal to 45 microns and the distance (d) between the axes of each pair of adjacent fibres is equal to twice the tracing pitch, i.e. 0.0508 mm.

5. A phototracer according to claim 1, in which the lens ratio is ½ and the tracing pitch is 0.0127 mm, characterised in that the diameter (D) of the fibres (26) is substantially equal to 45 microns and the distance (d) between the axes of each pair of adjacent fibres is four times the tracing pitch, i.e. 0.0508 mm.

6. A phototracer according to claim 5, characterised in that the slide (11) alternately advances through a distance equal to the tracing pitch and through a distance equal to the tracing pitch multiplied by unity, the first advance of the slide (11) being equal to nine times the tracing pitch.

7. A phototracer according to claim 1, in which each acousto-modulator (7) comprises an electrode for emitting an ultra-high frequency sound wave (50), characterised in that each modulator (7) comprises means for adjusting the difference between the light beam travelling through it and the electrode (50) so as to compensate the delay in deflecting the beam corresponding to the propagation time of the sound wave between the electrode (50) nd the light beam.

8. A phototracer according to claim 1, characterised in that each optical sub-system (25) comprises means for three-dimensionally adjusting the associated focusing device (28) in order to concentrate the laser beam in the corresponding fibre (26).

9. A phototracer according to claim 8, characterised in that the multi-frequency generator (35) generates a number of successive waves in a microsecond, the space filter (8) having an oopening (44) adapted to admit only those modulated beams (41) which correspond to the aforementioned frequencies, and the slide (11) comprises means for tilting it in a transverse direction perpendicular to the axis (Z—Z') of the film-holding roller (10) to compensate the linear motion of the roller (10) between the emission of the first sound wave and the emission of the last sound wave.

10. A phototracer according to claim 8, characterised in that each elementary advance of the slide (11) corresponds to a number of times the tracing pitch equal to the number of successive waves emitted by the multi-frequency generator (35).

11. A phototracer according to claim 1, in which the film-holding roller (10) comprises a region not covered by the film (2), characterised in that the optics-carrying slide (11) moves when the part of the roller (10) without a film is moving opposite the optical device (16, 29; 16, 8) borne by the slide (11).

12. A phototracer according to claim 3, characterised in that the lens (16) can be used to trace light spots with a pitch of 0.0127 mm.

* * * * *